United States Patent [19]

Fujino

[11] 4,026,742

[45] May 31, 1977

[54] PLASMA ETCHING PROCESS FOR MAKING A MICROCIRCUIT DEVICE

[76] Inventor: Katsuhiro Fujino, 83-3, Nishi Hassaku-cho, Midori, Yokohama, Japan

[22] Filed: Oct. 16, 1975

[21] Appl. No.: 622,862

Related U.S. Application Data

[63] Continuation of Ser. No. 466,717, May 3, 1974, abandoned, which is a continuation-in-part of Ser. No. 417,542, Nov. 20, 1973, abandoned.

[52] U.S. Cl. .............................. 156/643; 156/345; 156/646; 156/661; 156/656; 156/664; 204/192 E; 252/79.1; 427/88

[51] Int. Cl.² .......................................... C23F 1/02

[58] Field of Search ................ 156/3, 8, 11, 17, 18, 156/345; 204/129.1, 129, 129.65, 192; 427/88, 91; 96/36.2; 29/580, 591; 252/79.1

[56] References Cited

UNITED STATES PATENTS

| | | | |
|---|---|---|---|
| 3,615,956 | 10/1971 | Irving et al. | 156/17 |
| 3,795,557 | 3/1974 | Jacob | 156/8 |
| 3,837,856 | 9/1974 | Irving et al. | 96/36.2 |

*Primary Examiner*—William A. Powell
*Attorney, Agent, or Firm*—Staas & Halsey

[57] ABSTRACT

A method of making a microcircuit device wherein a uniform film of electrically conductive metal is deposited on the microcircuit surface and selectively removed from areas exposed through a mask. The improvement comprises the steps of contacting the exposed metal with a reactive halogenated gas in plasma state to convert the metal to a metal halide; and removing the metal halide to form a pattern of electrically conductive metal on the device.

The plasma can be generated in a reaction chamber with a high-frequency electromagnetic field. The process is useful in forming a desired pattern of metal for electrodes or wiring on a semiconductor substrate or other microcircuit base. The process is particularly useful for etching tungsten or molybdenum metal patterns.

4 Claims, 11 Drawing Figures

13

12

11

FIG. 1
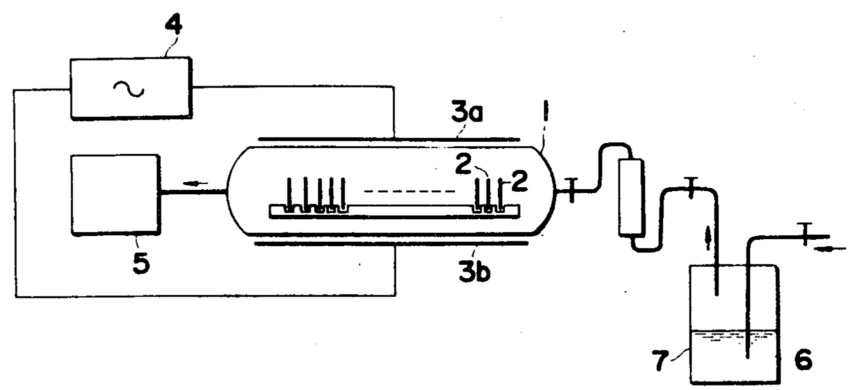
FIG. 2
13
12
11
FIG. 3
14
13
12
11
FIG. 4
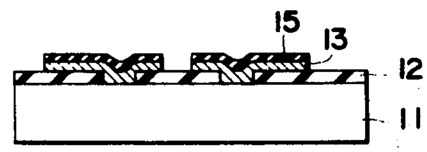
FIG. 5
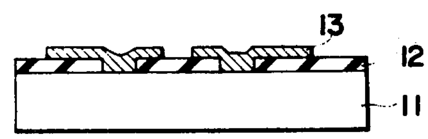

0.9
0.6
0.3
0
$\Delta V_{FB}$ (V)
INITIAL
ANNEAL
250°C
1H
+BT
250°C
+20V
1H

PLASMA ETCHING PROCESS FOR MAKING A MICROCIRCUIT DEVICE

REFERENCE TO COPENDING APPLICATION

This application is a continuation of application Ser. No. 466,717 filed May 3, 1974, now abandoned which is a continuation-in-part of U.S. patent application Ser. No. 417,542 filed Nov. 20, 1973, now abandoned.

BACKGROUND OF THE INVENTION

1. Field of the Invention

This invention relates to a method of making a microcircuit device, and more particularly to a method of making a semiconductor device including a process of patterning electrodes and wiring by plasma etching.

2. Description of the Prior Art

In semiconductor devices such as a transistor, an integrated circuit, a large-scale integrated circuit and so on, electrodes or wiring is mostly formed of aluminum (A1) but sometimes formed of platinum (Pt), gold (Au), titanium (Ti), molybdenum (Mo) or the like, too. For patterning such a metal film material, a liquid etching solution employing an etchant is usually employed. In these processes using tungsten (W), a heated aqueous solution of potassium hydroxide or sodium hydroxide, $HNO_3$—HF mixed solution, a heated aqueous solution of hydrogen peroxide or the like may be employed as an etchant. However, when using an etching mask formed of a photoresist material, there are instances where the photoresist material vanishes or peels off during etching, so that accurate patterning is difficult.

SUMMARY OF THE INVENTION

It is an object of this invention to provide a novel method of making a microcircuit device which is free from the aforesaid defect experienced in the prior art and capable of accurate patterning of electrodes and wiring of a microcircuit device in the case of using a reactive metal, such as tungsten, molybdenum, or the like.

In the method of making a microcircuit device according to this invention, the improvement comprises the steps of providing a mask on a metal layer for ultimately forming electrodes and wiring on a substrate, contacting the substrate in a reaction chamber with a gas of a halogen compound maintained in plasma state with a high-frequency electromagnetic field. This halogenates the non-masked or exposed portions of the metal layer on the substrate. The halogenated areas of the metal are removed, as by sublimation, evaporation or washing with water or a suitable solvent thus patterning the electrodes and wiring.

BRIEF DESCRIPTION OF THE DRAWINGS

FIG. 1 is a schematic diagram showing a preferred example of manufacturing apparatus for practicing a method of making a semiconductor device according to this invention;

FIGS. 2 to 5, inclusive, are vertical cross-sectional views of a semiconductor substrate, showing successive steps involved in producing a semiconductor device in accordance with this invention;

DESCRIPTION OF THE PREFERRED EMBODIMENTS

Figure 6:
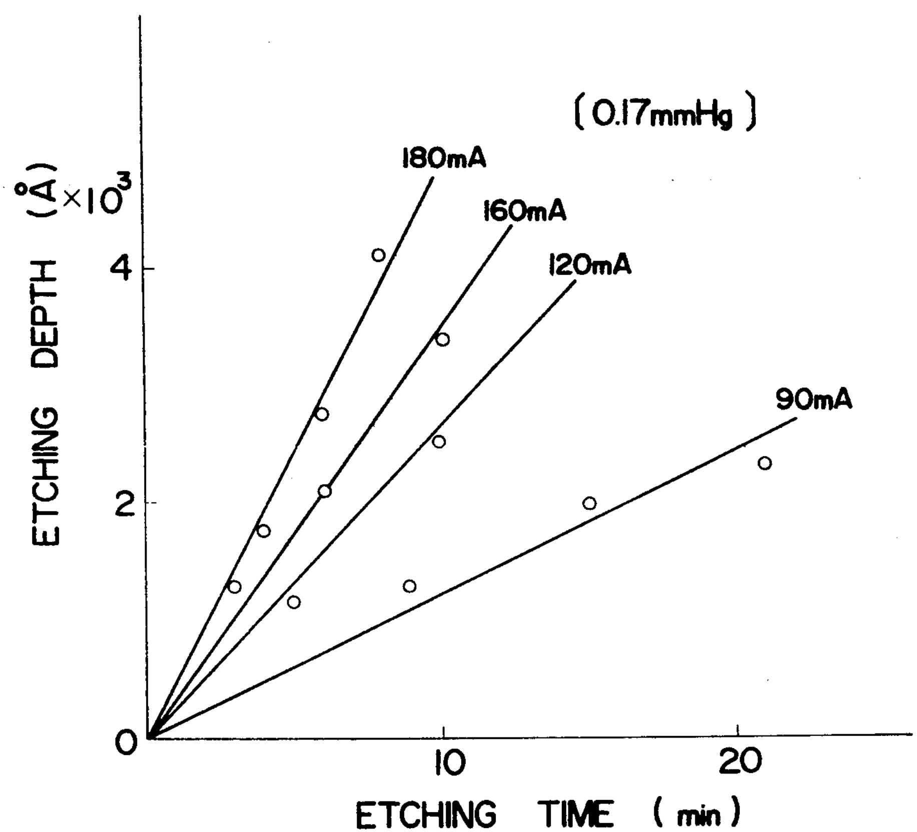
FIG. 6 is a graph showing the relationship between the etching time and the etching depth for tungsten metal.

FIG. 1 schematically shows an example of apparatus for use with this invention method. Semiconductor substrates 2 are disposed in a reaction chamber 1; the reaction chamber 1 is evacuated by means of a vacuum pump 5 to remove air; a voltage is impressed to electrodes **3*a* and 3*b* or a coil connected to a high-frequency, high-tension power source 4; and a halogen compound, for example, dichlorodifluoromethane (Freon-12, $CCl_2F_2$), contained in a container 7 is supplied into the reaction chamber 1** together with a gas stream of argon (Ar), helium (He) or other inert carrier gas. Volatile halogenated organic compounds may also be supplied alone or mixtures of such compounds may be used. The preferred halogenated materials include perhalogenated organic compounds, such as trichlorofluoromethane, dichlorodifluoromethane, or other volatile organic compounds containing halogen atoms having an atomic number between 9 and 35, especially chlorine and fluorine atoms; however, brominated compounds, such as $CHBr_3$, $CH_2BR_2$ or $CH_3Br$, may also be used. While iodide gas materials may be operable, the metal iodides possess high boiling points and do not appear practical. Inorganic halides such as $SiCl_4$ may also be used as a source of reactive halogen atoms. Selection of the halogenated gas depends upon the nature of the reactive metal.

The gas is maintained in a plasma state due to a high-frequency electromagnetic field established in the reaction chamber 1, and the plasma thus generated reacts with metal, thereby converting the exposed metal to a metal halide.

A suitable reaction chamber may be constructed according to FIG. 1 wherein a quartz tube 105 mm (i.d.) by 310 mm in length is provided with a copper coil of 8 mm wire having a coil diameter of 130 mm. In the examples, a coil of 13 turns was formed over a length of 250 mm. A suitable RF power supply provides a current of 180 mA at 1200 V and a frequency of 13.56 MHz. This obtains an etching rate of about 480 A/min at 180 mA for tungsten. In the preferred embodiments of the invention, the reaction chamber is constructed to permit etching rates greater than 250 A/min. Since the plasma state is maintained at more than 10,000° C, the chamber material is selected to withstand reaction conditions.

A suitable range of pressure for maintaining the plasma state is about 0.10 to 0.55 mm Hg (absolute pressure). The feed rate for the halogenated gas is maintained to provide a stoichiometric excess of the desired halogen atom in the reaction chamber. Optimum operating conditions for $CCl_2F_2$, for instance, were obtained using a constant flow rate of about 2 cc/min. under standard gas conditions (1 at m and room temp.), where the plasma was maintained at 0.17 mm Hg.

Where the vapor pressure of the metal halide is high, sublimation or evaporation of the halide takes place following plasma reaction to vapor etch the metal. An inert photoresist material reacts very little with the halogenated organic compound in the plasma state. Even if a small reaction occurs, the photoresist would not be etched away since its vapor pressure is low, compared to the metal halide. Further, silicon (Si) forming the semiconductor substrate 2 and silicon dioxide ($SiO_2$) or silicon nitride ($Si_3N_4$) forming insulating films are not etched substantially.

The boiling points (bp) and the melting points (mp) of various metal halides are shown in the following tables. The halides of high vapor pressure at room temperature are shown in Table 1 and those of low vapor pressure are shown in Table 2.

Table 1

| | bp(° c) | mp(° c) |
|---|---|---|
| $WF_6$ | 17.5 | 2.5 |
| $MoF_6$ | 35.0 | 17 |
| $ReF_6$ | 47.6 | 18.8 |
| $OsF_8$ | 47.5 | 34.4 |
| $IrF_6$ | 53 | 44 |

Table 2

| | bp(° c) | mp(° c) |
|---|---|---|
| $AlCl_3$ | 180.2 (solid phase) | 190 |
| $AlBr_3$ | 255 | 99.5 |
| $TiCl_4$ | 136.4 | 30 |
| $TiF_4$ | 285 | — |
| $TiBr_4$ | 230 | 390 |
| $VF_5$ | 112 (758 mmHg) | — |
| $NbF_5$ | 229 | 75.5 |
| $MoCl_5$ | 268 | 194 |
| $TaCl_5$ | 242 | 217 |
| $TeF_5$ | 229 | 97 |
| $RuF_5$ | 250 | 101 |

In the case of using the halides of high boiling point, removal in vapor phase can be achieved by raising the temperature of the semiconductor 2.

FIGS. 2 to 5 show a sequence of steps involved in the manufacture of a semiconductor device in accordance with one example of this invention. An insulating film 12 as of silicon dioxide ($SiO_2$) or silicon nitride ($Si_3N_4$) is formed on a silicon semiconductor substrate 11 by a known process and the insulating film 12 is selectively removed to form windows therein. A tungsten (W) layer 13 is then formed uniformly over the entire area of the insulating film 12 and the exposed area of the substrate 11, as by chemical vapor deposition, evaporation, sputtering or the like, as depicted in FIG. 2. The insulating film 12 and the tungsten layer 13 may be formed to desired thicknesses of 2000 to 5000 and about 10,000 A (1$\mu$) respectively. Optimum thickness for $SiO_2$ is about 5000A, for $Si_3N_4$ about 3000 A.

Then a photoresist layer 14 is formed over the entire area of the tungsten layer 13. This is followed by patterning of the photoresist layer 14, by which the photoresist layer 14 is removed at selected locations to form windows therein through which the underlying tungsten layer 13 is exposed, as illustrated in FIG. 3. The photoresist layer 14 serves as a vapor-phase etching mask in the subsequent step of the inventive process.

Next, as described previously with regard to FIG. 1, the semiconductor substrate is placed in the reaction chamber 1, the aforementioned dichlorodifluoromethane is introduced into the reaction chamber 1 as a gas, and a high-frequency voltage is impressed to the electrodes 3*a* and 3*b* or the coil to generate a plasma. The exposed areas of the tungsten layer 13 are halogenated into tungsten hexafluoride ($WF_6$). The tungsten hexafluoride is volatile at room temperature, and hence is sublimited or evaporated. This removal step forms windows to expose therethrough the insulating layer 12 at selected locations, as depicted in FIG. 4. In this manner, the vapor etching is achieved.

Thereafter, the photoresist layer 14 remaining on the tungsten layer 13 is removed as illustrated in FIG. 5. In this case, since the photoresist is organic matter, the layer 14 can be removed by introducing oxygen ($O_2$) into the reaction chamber 1 in place of the halogenated gas.

Thus, patterning of tungsten, which is chemically stable in most environments and difficult to melt, can be carried out with great accuracy.

Although the foregoing example has been described in connection with tungsten (W) it is possible to effect patterning in evenly deposited films of metals such as aluminum (Al), molybdenum (Mo), titanium (Ti), etc., employed as electrically conductive materials for electrodes or wiring of semiconductor devices. Aluminum is difficult to convert to its fluoride ($AlF_3$) and not easy to etch in this form. Therefore, it is preferred to convert aluminum metal to another halide form, such as the chloride ($AlCl_3$).

Further, since halides of gold (Au), chromium (Cr), iron (Fe), cobalt (Co), nickel (Ni), platinum (Pt), or the like are soluble in water, an aqueous solution of acid or organic liquid or react therewith, it is also possible to etch away the non-masked or exposed metal layer by dissolving the metal halide in a liquid solvent, such as water or the like after converting the metal layer into a halide of the metal as previously described.

FIG. 6 shows the relationship between the time for etching tungsten according to the method of this invention described above and the etching depth in the case where the pressure in the reaction chamber 1 shown in FIG. 1 is 0.17 mmHg, a current flowing in the coil supplied with the high-frequency voltage being used as a parameter. For example, where the coil current was 160 mA, the tungsten layer was etched away to a depth of 3500 A in 10 minutes. Further, where the coil current was 120 mA, the tungsten layer was etched away to a depth of 2500 A in 10 minutes. With reduced coil current to lower the intensity of the high-frequency magnetic field, the intensity of plasma is lowered to decrease the etching speed. Further, it has been found that the etching depth increases linearly with respect to time.

Figure 7:
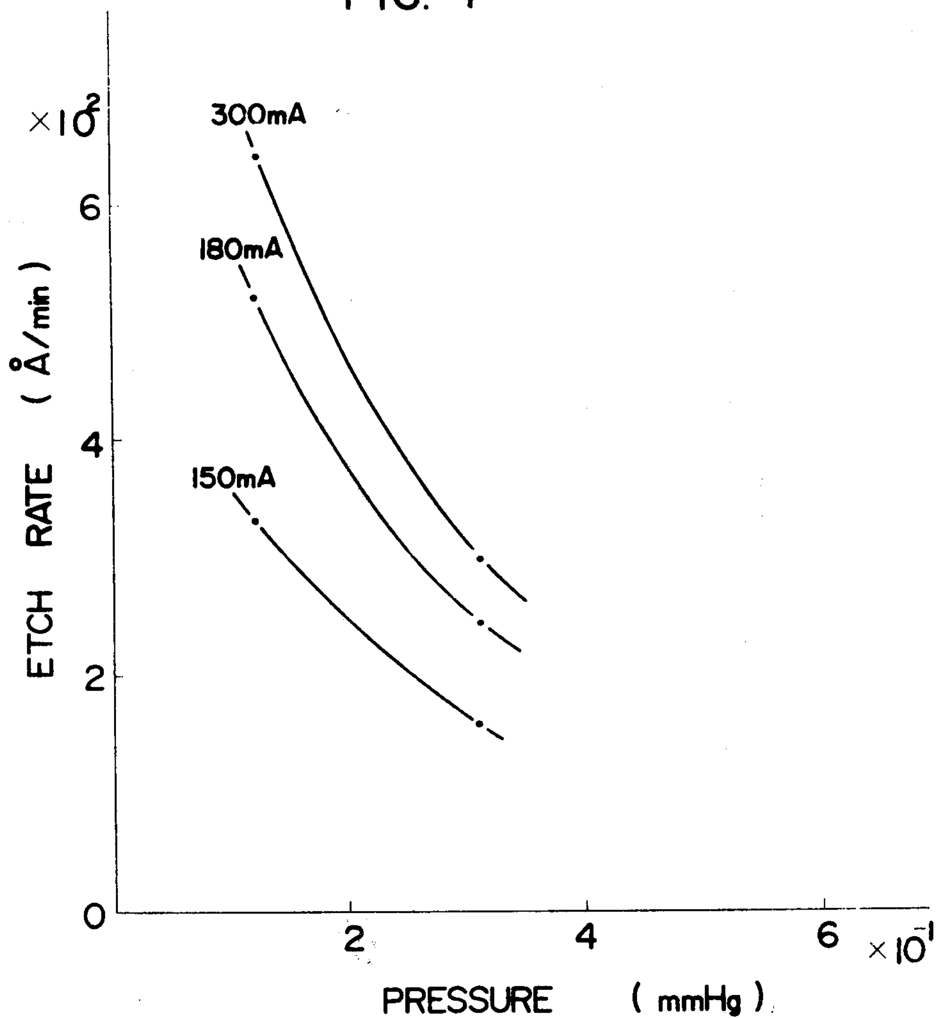
FIG. 7 is a graph showing the relationship between the pressure in a reaction furnace and the etching rate in connection with tungsten.

FIG. 7 shows the relationship between the pressure (in mm Hg) in the reaction chamber 1 and the etching rate (in A/min) in connection with tungsten, coil current being the parameter. The etching rate tends to drop with increase in pressure and with decrease in the coil current. It is believed that if the pressure is lowered out of the given range, the etching rate rapidly decreases below a certain value.

The optimum etching rate can be determined for each reactive metal and mask material, usually above 250 A/min. Higher rates are not always favorable, because organic photoresistant materials may react undesirably. Also, color and dimensional stability may be changed. Rates up to 480 A/min have been obtained.

Figure 8:
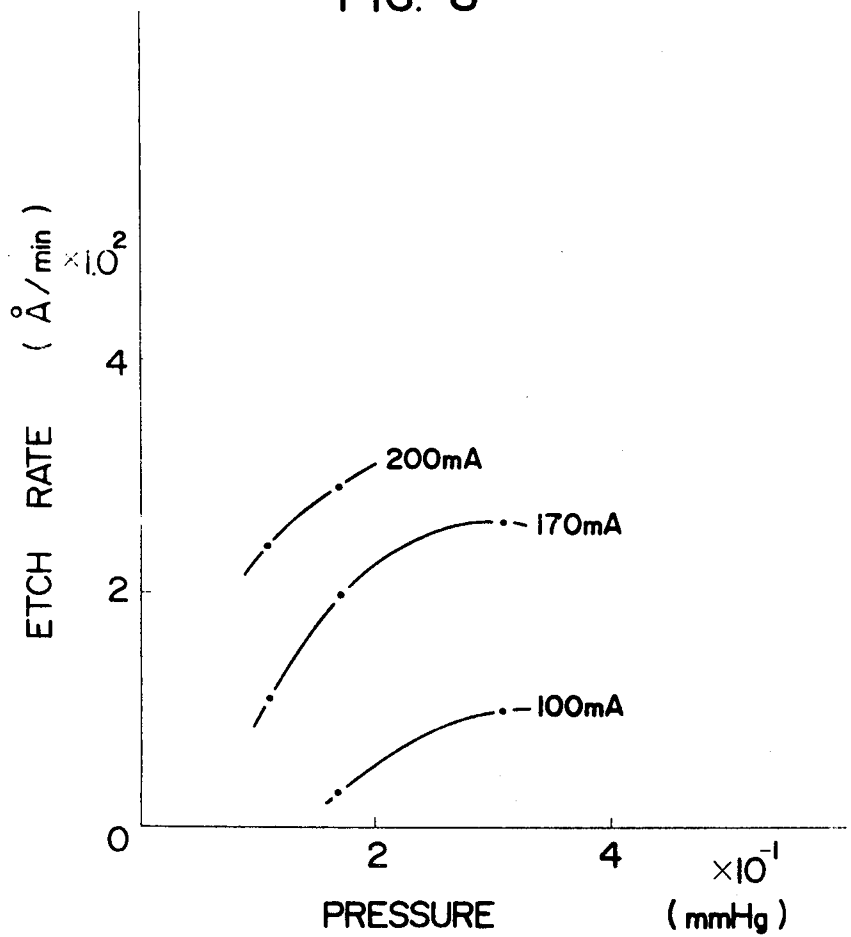
FIG. 8 is a graph showing the relationship between the pressure in the reaction furnace and the etching rate in the case of using molybdenum.

FIG. 8 shows the relationship between pressure (in mmHg) in the reaction chamber 1 and etching rate (in A/min) for molybdenum, coil current being the parameter. At a certain value of pressure, a maximum etching rate can be obtained but such prèssure is higher than that found in the case of tungsten.

Figure 9A:
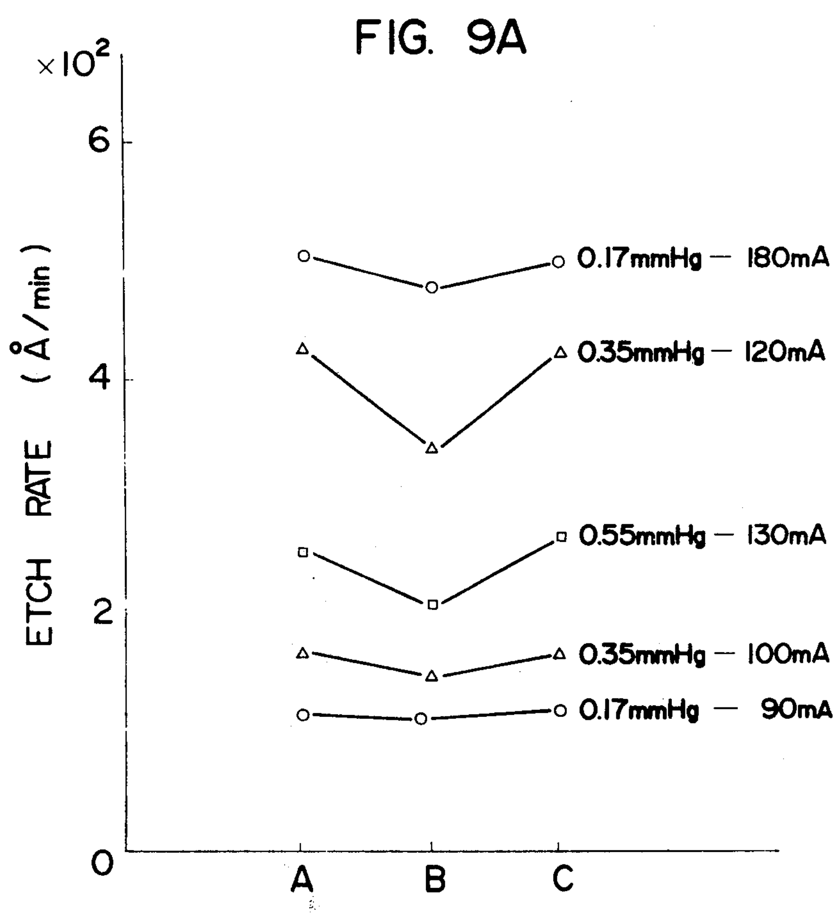
FIGS. 9A and 9B are graphs showing the distribution of the etching rate in the surface of a water formed of tungsten.
Figure 9B:
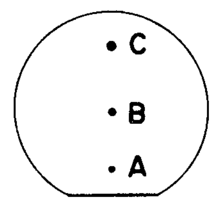

FIG. 9A shows the distribution of the etching rate in the wafer surface in the case of etching tungsten. The points of measurement are those three linear spaced points A, B, and C shown in FIG. 9B. Values on the right-hand side of each curve represent the pressure in the reaction chamber and the coil current. Where a low pressure in the reaction chamber is employed and the coil current is decreased, the etching rate is decreased; however, the etching rate is distributed uniformly in the water surface.

Figure 10:
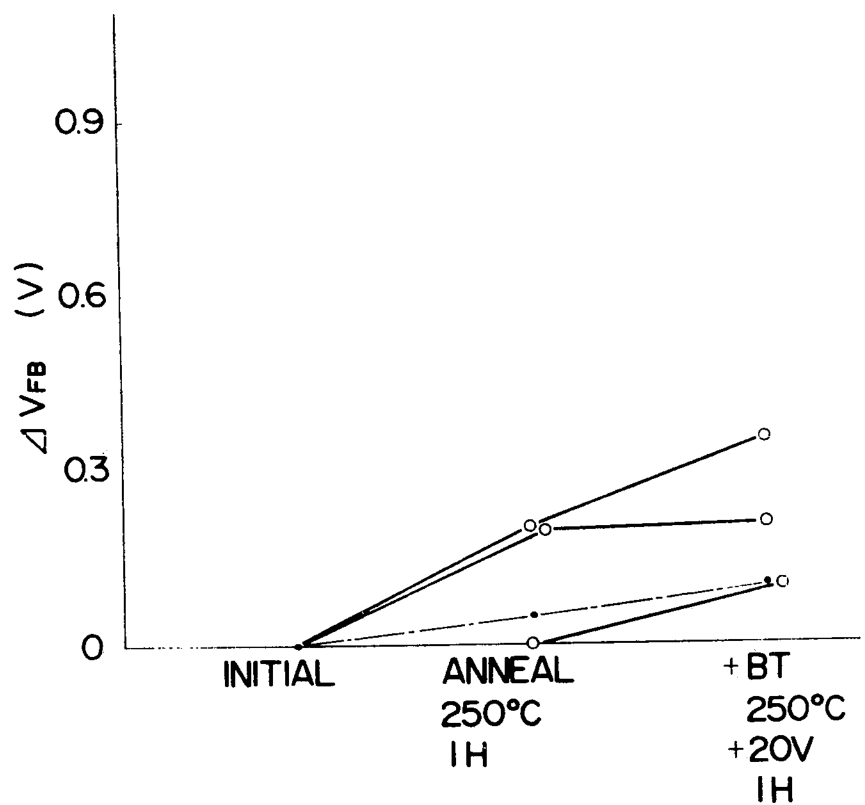
FIG. 10 is a graph showing characteristic curves of variations in the flat band voltage $V_{FB}$ of a tungsten gas MOS diode produced by liquid etching and that produced by the plasma etching method of this invention.

FIG. 10 shows variations in the flat band voltage $V_{FB}$ of a tungsten gate MOS diode which are caused by heat treatment. The dashed line represents the case of conventional liquid etching and the solid lines represent the case of plasma etching of this invention. When a heat treatment for an hour at a temperature of 250° C is maintained from the initial state, the change of the flat band voltage of the diode produced according to this invention was less than 0.2V, and when heat treatment was effected at 250° C for an hour with a voltage of +20V being impressed, a maximum change of the flat band voltage of the diode according to this invention was 0.35V. A large change in the flat band voltage resulting from heat treatment implies that the wafer is damaged, for instance in the etching process. In the case of heating while impressing a voltage, the change in the flat band voltage is further increased. However, as depicted in FIG. 10, the plasma etching according to this invention does not create a large change in the flat band voltage, from which it is concluded that the semiconductor device is not damaged by the plasma etching. As has been described in the foregoing, in the present invention, those metal areas of an electrode or wiring metal which are to be etched away are reacted in halogen plasma and the halogenated areas are removed by utilizing high vapor pressure of the halide or its solubility in water or the like, thereby to effect patterning. This eliminates the possibility of the etching mask peeling off or vanishing thereby assuring accurate patterning, and thus providing for enhanced reliability and characteristics of semiconductor devices.

What is claimed is:

1. A method of making a microcircuit on a semiconductor substrate comprising the steps of:

covering said semiconductor substrate with an insulating film;

photoetching said insulating film at desired locations to form windows therein exposing the said semiconductor substrate;

forming a reactive electrically conductive metal layer selected from the group consisting of tungsten, molybdenum, rhenium, osmium and iridium covering said insulating film and extending through said windows for covering the exposed semiconductor substrate;

forming a mask layer of photoresist in a desired pattern on said reactive electrically conductive metal layer;

contacting said semiconductor substrate with a plasma composed only of a halogenated gas consisting essentially of a perhalogenated organic compound containing fluorine atoms generated by a high-frequency electromagnetic field in an inert carrier gas under a reduced pressure of about 0.10 to0.55 mm Hg, thereby converting said reactive electrically conductive metal of those areas which are not covered with said mask layer to a metal fluoride and removing said metal fluoride; and removing said photoresist mask layer with a gas containing oxygen in a plasma state to form a wiring layer of the reactive electrically conductive metal layer remaining on said insulating film.

2. The method of claim 1 wherein the halogenated gas consists essentially of dichlorodifluoromethane.

3. The method of claim 1 wherein said exposed metal is etched at a rate of at least about 400 A/min.

4. The method of claim 1 wherein the metal film is uniformly deposited to a thickness up to about 10,000 A.

* * * * *

UNITED STATES PATENT AND TRADEMARK OFFICE
CERTIFICATE OF CORRECTION

PATENT NO. : 4,026,742

DATED : May 31, 1977

INVENTOR(S) : Katsuhiro Fujino

It is certified that error appears in the above-identified patent and that said Letters Patent are hereby corrected as shown below:

Column 2, line 8, change "water" to -- wafer --.
Column 3, line 56, change "2000 to 5000" to -- 2000A to 5000A --
Column 4, line 8, change "sublimited" to -- sublimated --.
Column 5, line 18, change "water" to -- wafer --.
Column 6, line 29, change "to0.55" to -- to 0.55 --.

Signed and Sealed this

*Eleventh* Day of *October 1977*

[SEAL]

*Attest:*

RUTH C. MASON
*Attesting Officer*

LUTRELLE F. PARKER
*Acting Commissioner of Patents and Trademarks*

UNITED STATES PATENT OFFICE

CERTIFICATE OF CORRECTION

Patent No. 4,026,742 Dated May 31, 1977

Inventor(s) Katsuhiro Fujino

It is certified that error appears in the above-identified patent and that said Letters Patent are hereby corrected as shown below:

After line "[76]" insert --Assignee: Fujitsu Limited, Japan--.

Signed and Sealed this

*Twenty-second* Day of *November 1977*

[SEAL]

*Attest:*

RUTH C. MASON
*Attesting Officer*

LUTRELLE F. PARKER
*Acting Commissioner of Patents and Trademarks*

UNITED STATES PATENT AND TRADEMARK OFFICE
CERTIFICATE OF CORRECTION

PATENT NO. : 4,026,742
DATED : May 31, 1977
INVENTOR(S) : Katsuhiro Fujino

It is certified that error appears in the above-identified patent and that said Letters Patent are hereby corrected as shown below:

Please insert -- [30] Foreign Application Priority Data
Japanese Patent Application No. 47-117464,
filed November 22, 1972 --.

Signed and Sealed this

*Tenth* Day of *October 1978*

[SEAL]

*Attest:*

RUTH C. MASON
*Attesting Officer*

DONALD W. BANNER
*Commissioner of Patents and Trademarks*